United States Patent
Lyding et al.

(10) Patent No.: US 10,060,948 B2
(45) Date of Patent: Aug. 28, 2018

(54) SCANNING PROBE AND ELECTRON MICROSCOPE PROBES AND THEIR MANUFACTURE

(71) Applicant: Tiptek, LLC, West Chester, PA (US)

(72) Inventors: Joseph W. Lyding, Champaign, IL (US); Gregory S. Girolami, Urbana, IL (US); Scott P. Lockledge, West Chester, PA (US); Jinju Lee, Champaign, IL (US)

(73) Assignee: Tiptek, LLC, West Chester, PA (US)

( * ) Notice: Subject to any disclaimer, the term of this patent is extended or adjusted under 35 U.S.C. 154(b) by 0 days.

(21) Appl. No.: 15/235,889

(22) Filed: Aug. 12, 2016

(65) Prior Publication Data
US 2018/0045755 A1    Feb. 15, 2018

(51) Int. Cl.
*G01Q 70/16*    (2010.01)
*G01Q 70/10*    (2010.01)
*G01Q 60/00*    (2010.01)
*G01Q 60/16*    (2010.01)

(52) U.S. Cl.
CPC ............ *G01Q 70/10* (2013.01); *G01Q 60/00* (2013.01); *G01Q 60/16* (2013.01); *G01Q 70/16* (2013.01)

(58) Field of Classification Search
CPC . H01J 2209/0026; G01Q 60/00; G01Q 60/16; G01Q 70/10; G01Q 70/16
See application file for complete search history.

(56) References Cited

U.S. PATENT DOCUMENTS

| | | | |
|---|---|---|---|
| 6,329,214 B1 * | 12/2001 | Hattori | H01J 9/025 257/10 |
| 8,070,920 B2 | 12/2011 | Lyding | |
| 8,621,660 B2 | 12/2013 | Watanabe et al. | |
| 8,819,861 B2 | 8/2014 | Lyding | |
| 2004/0256577 A1 * | 12/2004 | Stevens | H01J 37/20 250/492.21 |
| 2009/0106869 A1 * | 4/2009 | Park | B82Y 15/00 850/60 |
| 2009/0297422 A1 * | 12/2009 | Zuo | C01B 32/168 423/290 |
| 2012/0159678 A1 * | 6/2012 | Lyding | B82Y 35/00 850/57 |

OTHER PUBLICATIONS

Vasile, M. J., et al. "Scanning probe tips formed by focused ion beams." Review of scientific instruments 62.9 (1991): 2167-2171.*
International Search Report for International Application No. PCTUS1746000 dated Jan. 18, 2018.

(Continued)

*Primary Examiner* — Wyatt Stoffa
(74) *Attorney, Agent, or Firm* — Frank Rosenberg

(57) ABSTRACT

Methods are described for the economical manufacture of Scanning Probe and Electron Microscope (SPEM) probe tips. In this method, multiple wires are mounted on a stage and ion milled simultaneously while the stage and mounted probes are tilted at a selected angle relative to the ion source and rotated. The resulting probes are also described. The method provides sets of highly uniform probe tips having controllable properties for stable and accurate scanning probe and electron microscope (EM) measurements.

20 Claims, 4 Drawing Sheets

(56) References Cited

OTHER PUBLICATIONS

Written Opinion for International Application No. PCTUS1746000 dated Jan. 18, 2018.

Biegelsen, D.K. et al, "Ion milled tips for scanning tunneling microscopy," Appl. Phys. Lett., Mar. 16, 1987, vol. 50, No. 11, 696-698.

Biegelsen, F.A., "Simple ion milling preparation of (111) tungsten tips", Appl. Phys. Lett., Mar. 27, 1989, vol. 54, No. 13, 1223-1225.

Hoffrogge, P. et al., "Nanostructuring of tips for scanning probe microscopy by ion sputtering: Control of the apex ratio and the tip radius," J. Appl. Phys. (2001), vol. 90, No. 10, 5322-5327.

Jayaraman, Sreenivas et al.,"Hafnium diboride thin films by chemical vapor deposition from a single source precursor," J. Vac. Sci. Technol., A 23 (6), 1619-1625, (2005) https://doi.org/10.1116/1.2049307.

Jensen. James A. et al., "Titanium, Zirconium, and Hafnium Tetrahydroborates as "Tailored" CVD Precursors for Metal Diboride Thin Films", J. Am Chem. Soc., (1988), 110, 5, 1643-44.

Lisovskii, A.F., "Sintered Metals and Alloys: Cemented Carbides Alloyed with Ruthenium, Osmium, and Rhenium", Powder Metallurgy and Metal Ceramics, vol. 39, No. 9-10, 2000.

Mahmud, S.F., et al, "Ultra-Sharpening of Diamond Stylus by 500 eV O+/O2+ Ion Beam Machining without Facet and Ripple Formation", Int. J. Nanosci. Nanotechnol., Sep. 2012, pp. 127-134, vol. 8, No. 3.

Sigmund, Peter, "Elements of Sputtering Theory", PSP Review Volume, Apr. 13, 2011, Pan Stafford Publishing, 10.1201/b13726.

Wei, Qiangmin, "Angular dependence of sputtering yield of amorphous and polycrystalline materials", J. Phys. D: Appl. Phys (2008), 172002, pp. 1-4., vol. 41.

Zhang. R., "Preparation of sharp polycrystalline tungsten tips for scanning tunneling microscopy imaging," J. Vac. Sci. Technol. B 14 (1) 1 (1996) pp. 1-10, doi: 10.116/1.58902910.

\* cited by examiner

SCANNING PROBE AND ELECTRON MICROSCOPE PROBES AND THEIR MANUFACTURE

INTRODUCTION

For accurate and stable imaging, Scanning Probe and Electron Microscopy (SPEM) requires probes that are hard, often electrically-conductive and provide a single, sharp, tip. Conventionally, such tips are typically made by electrochemical etching or polishing and the resulting etched or polished probes may be subjected to subsequent processing. Several publications have also described the use of ion milling at inclined angles with respect to the tip axis, combined with rotation of the tips, as part of a process to form EM probes. Such "tilt and rotate" prior art, however, suffers from one or several limitations, such as (1) incompatibility with a batch process capable of processing many probes at once, or (2) inferior geometry due to insufficiently sharp and or poorly shaped tips.

For example, Hoffrogge et al. in "Nanostructuring of tips for scanning probe microscopy by ion sputtering: Control of the apex ratio and the tip radius," J. Appl. Phys. 90, 5322 (2001) describe ion milling of previously chemically etched tungsten tips, in which the tips are rotated about their axes during milling (although the rotation speed is not specified). The authors state that by "variation of the angle between the ion beam and the macroscopic tip, the tip angle can be controlled in the range between 12° and 35°." Hoffrogge et al. define the ion angle (alpha) to be the angle between the rotation axis of the tip and the axis of the ion beam. They state that "the apex ratio is usually defined as the ratio of the tip diameter at a distance of 0.5 μm from the very tip to that distance; it can be used to characterize the back part of the tip instead of the tip angle." In other words apex ratio= (width as measured 0.5 μm back from the tip)/(0.5 μm). An equivalent parameter to describe the back part of the tip is the cone angle (also known as the taper angle or tip angle), which is related to the apex ratio by the formula cone angle=2 arctan(apex ratio/2). Thus if apex ratio=0.2, then cone angle=11.4°; if apex ratio=0.65, then cone angle=36°. Hoffrogge et al. report that: "To obtain a small apex ratio of 0.2, an ion angle of about 90° or more is required . . . . At small ion angles, the apex ratio is rather large with values of about 0.65 or even more. A reduction of the original tip radius occurs under almost all conditions. After a bombardment time depending on the specific conditions used, the tip reaches its final shape, i.e., further bombardment does not change the shape of the foremost part of the tip." Thus, Hoffrogge et al. teach that apex angles of 0.2 (i.e., cone angles close to 11°) can be obtained only if the ion angle is 90° or more. In other words, the ion beam must approach the tip from below the tip. They also mention "It is important to perform the experimental work under clean vacuum conditions. Hydrocarbon contamination on the electrochemically etched crude tip can have a significant influence on the final shape because carbon has a very low sputter yield, thus a carbon layer can serve as a 'shield' against sputtering of the metallic tip. After ion sputtering, the surfaces are clean and highly reactive. The tips have to be stored and handled properly to avoid contamination and reactive processes like oxidation before their use"

Biegelsen et al. in "Ion milled tips for scanning tunneling microscopy," discuss ion milling of tungsten tips that were rotated at 2 rpm. "A beam of 4-5 keV Ar+ incident at an angle alpha=0-40° below the horizon[tal] irradiated the tip (gun current ca. 0.4 mA)" Their FIG. 3 shows that their alpha angle corresponds to an ion angle (as defined by Hoffrogge et al.) of 90 to 130°. See Appl. Phys. Lett. 50, 696 (1987) and Appl. Phys. Lett. 54, 1223 (1989). As was the case for Hoffrogge, Biegelsen et al. teach that the sharpest tips are obtained if the ion beam approaches the tip from below the tip. This method, however, suffers from a significant limitation, which is that it is incompatible with batch processing, whereby dozens or even hundreds of probes mounted on a stage are processed simultaneously in the same ion beam. This is because the stage used to maintain a plurality of probes in the beam cross section will necessarily serve as a physical obstacle to the ion beam, which will prevent the beam from milling the probes uniformly. In contrast to the method of Biegelsen, in the invention described below, the ion beam approaches the tip from above the tip (ion angle of less than 90°); This alternative geometry readily accommodates integration into a batch processing mode in which all the probes experience approximately the same amount of milling.

Zhang and Ivey in "Preparation of sharp polycrystalline tungsten tips for scanning tunneling microscopy imaging," J. Vac. Sci. Technol. B 14(1) (1996) describe a technique for making STM tips. The authors stated that the purpose of their article was "to fabricate STM tips from W by electrochemical polishing and a combination of electrochemical polishing and ion milling" and that "Fabrication parameters [were] optimized in an effort to produce the sharpest, most reproducible tips." Initially, a polycrystalline W wire was electrochemically etched in a sodium hydroxide solution to form a neck in the wire that severs to produce a tip and the etched wire was removed from solution. The wire was then rotated and exposed to a flux of 4.5 keV Ar ions at an incidence angle of 30° (corresponding to an ion angle of 60°) and a current density of about 1 mA/cm$^2$ for 40 minutes. These optimized conditions were reported to reduce tip radius to 20 nm and cone angle was reduced from 35° to 25°. Longer milling times are reported to result in blunter tips and multiple tips. Zhang et al. reported that "Parameters such as voltage and current density affect thinning time, while incidence angle affects cone angle," and that "For longer milling times, blunter tips or even multiple tips can form, which has been reported previously."

In order to sharpen a tip and reduce the radius or curvature, more material must be removed from the sides than from the tip apex. Zhang et al. achieves this by ion milling at an incident angle 30° from the plane that is perpendicular to the rotation axis in a flux of 4.5 KeV Ar ions. Both experimental data (Sigmund 2011) and sputter yield theory (Wei 2008) indicate that normalized sputter yield increases as the energy of the incident ion increases, over a broad range of angle of incidences, indicating that an ion of higher energy would remove a greater number of substrate atoms from the sides than one at lower energy at a given angle using the conditions of Zhang et al. Therefore, the conventional wisdom would have predicted that use of ions of lower energy than the 4500 eV used by Zhang and/or use of current densities smaller than the 1 mA/cm$^2$ used by Zhang would lead to blunter tips with a diameter of curvature greater than the 40 nm seen by Zhang. Surprisingly and unexpectedly, we find that sharper tips and smaller diameters of curvature (<35 nm) are found at such lower ion energies and/or lower current densities.

SUMMARY OF THE INVENTION

In a first aspect, the invention provides a method of making SPEM probes, comprising: mounting a plurality of wire pieces to a rotatable stage; rotating the stage with mounted wire pieces and simultaneously milling the wires with an ion beam having an ion energy in the range of 1 to 3500 eV to produce the probe tips mounted to the stage; wherein the rotating stage has an axis of rotation; wherein the angle between the axis of rotation and the ion beam is from 5 to 70; where the angle is defined with respect to the axis of rotation such that 0° is defined to be the angle if the ion beam originates from directly above the stage and is parallel to the axis of rotation. In some embodiments, the invention includes one or any combination of the following characteristics: the ion beam comprises Ar ions; the angle between the axis of rotation and the ion beam is from 15 to 65; the angle between the axis of rotation and the ion beam is from 45 to 65°; the wire pieces mounted to stage are not subjected to electropolishing prior to milling; the plurality of wire pieces are tungsten wires; the plurality of wire pieces comprise a material selected from the group consisting of beryllium copper (Be—Cu) alloy, platinum (Pt), iridium (Ir), platinum-iridium (Pt—Ir) alloy, tungsten (W), tungsten-rhenium (W—Re) alloy, palladium (Pd), palladium alloy, gold (Au), and commercial alloys (NewTek™, Paliney 7™ (Pd along with small percentages of Ag, Au, Pt, Cu, and Zn), Paliney H3C and Paliney C (Pd alloys with Pd, Ag, and Cu)); the plurality of wire pieces comprise a coating of $HfB_2$; further comprising a broad beam ion source that generates the ion beam, comprising an evacuation chamber housing the ion beam, stage and plurality of wires; where the plurality of wires comprises a batch of 5 to 10,000 wire pieces; where the stage is rotated at a rate of 1 to 100 rpm; where the ion beam has an ion energy in the range of 100 eV to 3500 eV; where the ion flux from the source is in the range of $10^{14}$ to $10^{17}$ ions/cm$^2$s; where the ion beam has an ion energy in the range of 1000 eV to 2000 eV; wherein the ion beam is conducted with a current density of 0.2 to 0.8 mA/cm$^2$; and where the exposure to the ion beam is conducted for 30 minutes to 120 minutes or for 60 to 120 minutes; and/or where, at the end of the exposure, the wires are removed from the stage and wherein at least 80% of the individual probes have the following features:
a single tip on each probe body having cone angles of 5° to 30°, and a diameter of curvature in the range of 15 to 30 nm.

The invention also includes a batch of SPEM probes made by the inventive methods.

In another aspect, the invention provides a SPEM probe or batch of SPEM probes, wherein each SPEM probe comprises: a cylindrical rod having a rod diameter in the range of 1 to 2000 µm, and comprising a single tip at one end; tips that are substantially oxide free as characterized by having less than 5 nm of oxide as imaged by TEM; wherein the tip has: a cone angle of 5 to 45°; and a diameter of curvature of 1 to 35 nm. In some embodiments, the invention includes one or any combination of the following characteristics: comprising a batch of SPEM probes mounted on a stage; wherein each SPEM tip has a cone angle in the range of 9 to 15°; wherein each SPEM tip has a diameter of curvature of 1 to 10 nm; wherein each SPEM tip has a diameter of curvature of 1 to 10 nm; wherein each SPEM probe comprises a cylindrical rod having a rod diameter in the range of 250 to 500 µm; and/or wherein the probes have striations indicative of ion milling.

In various embodiments, the invention may provide advantages, including one or more of the following: increased efficiency with less waste of probe material; less oxygen and, in general, fewer impurities as compared to conventional processes; greater uniformity; better performance during EM operation; superior probe geometry, and faster manufacturing speed per probe with fewer steps.

Glossary

"Cone angle," also known as taper angle or tip angle, is illustrated in FIG. 2. Usually it is clear from the photomicrograph of a probe. For purposes of heightened clarity, in the present invention, it is the angle at the tip that characterizes a triangle drawn between the tip and the sides of the probe at points 1.5 µm back from tip (where the 1.5 µm refers to the distance along the central axis of the probe to the tip).

"Ion angle" is the angle between the axis of the ion beam and the axis of a rotating tip. Ion angles less than 90° correspond to the ion beam approaching the tip from above the tip.

"Radius of curvature" is typically determined by measuring the radius of the largest circle that fits into the tip of a probe as shown in FIG. 3. Obviously, the radius is half of the diameter. The tip dimensions are taken from a photomicrograph of the probe tip. In cases where it is not clearly apparent, or where there is a reasonable dispute, the radius of curvature is to be obtained by the method of Watanabe et al., U.S. Pat. No. 8,621,660, incorporated herein by reference.

Scanning probe and electron microscope (SPEM) probe. SPEM probes are used in a device to interact with a surface. Examples include, but are not limited to nanoprobers used in semiconductor circuit failure analysis, scanning probe microscopes such as scanning tunneling microscopes or atomic force microscopes, or any device wherein a probe tip interacts with a surface.

The phrase "tips that are substantially oxide free as characterized by having less than 5 nm of oxide as imaged by TEM" refers only to the section of the probe that is within 500 nm of the tip. An example of a tip where oxide is present is shown in FIG. 4, while a tip that is substantially oxide free is shown in FIG. 5. The thickness of the oxide coating can be seen in the TEM microphotograph.

As is standard patent terminology, the term "comprising" means "including" and does not exclude additional components. Any of the inventive aspects described in conjunction with the term "comprising" also include narrower embodiments in which the term "comprising" is replaced by the narrower terms "consisting essentially of" or "consisting of." As used in this specification, the terms "includes" or "including" should not be read as limiting the invention but, rather, listing exemplary components.

DETAILED DESCRIPTION

The SPEM probe is manufactured from a piece of wire (defined as a material having a length to diameter ratio of at least 5, preferably at least 10, more typically at least 100 or, in some embodiments, in the range of 10 to 1000). Wire pieces for the starting materials preferably have a diameter between 0.15 mm and 1.00 mm and a length in the range of 0.5 to 3 cm, more preferably 1.5 to 2.5 cm and are etched to a point. The probe materials may be any of the materials conventionally used for SPEM probes. Thus, in preferred embodiments, the probe comprises a material selected from the group consisting of beryllium copper (Be—Cu) alloy, platinum (Pt), iridium (Jr), platinum-iridium (Pt—Ir) alloy, tungsten (W), tungsten-rhenium (W—Re) alloy, palladium (Pd), palladium alloy, gold (Au), and commercial alloys (NewTek™, Paliney 7™ (Pd along with small percentages of Ag, Au, Pt, Cu, and Zn), Paliney H3C and Paliney C (Pd alloys with Pd, Ag, and Cu)). These materials may be used by themselves or with a coating such as Ag, WC, TiN, or $HfB_2$. Suitable methods for applying such coatings are known in the literature; for example, in Jensen et al., J. Am. Chem. Soc. 110, 1643-44 (1988); Jayaraman et al., J. Vac. Sci. Technol. 23, 1619 (2005); and Jayaraman et al., Surface & Coatings Technol. 200, 6629-6633 (2006), all of which are incorporated herein by reference. We have prepared SPEM probes from W and Pt—Ir having the advantageous properties of cone angle and radius of curvature discussed in this description. We have also prepared SPEM probes with $HfB_2$ coatings having the discussed advantageous properties. The materials listed above are believed to behave similarly under the ion milling conditions described in this description and likewise are believed to result in similar finished SPEM probes.

Before processing the wire pieces according to the inventive method, the wire pieces are pre-sharpened by known methods. Preferably, this is done by electrochemical etching by a technique such as that described by Zhang et al., which is referenced above. Typically, a coating, if present, is applied after the electrochemical etch. The coating can be applied either before or after the ion milling process described here, and $HfB_2$ coatings have been applied after the ion milling such that little or no additional sharpening is needed.

Figure 1:
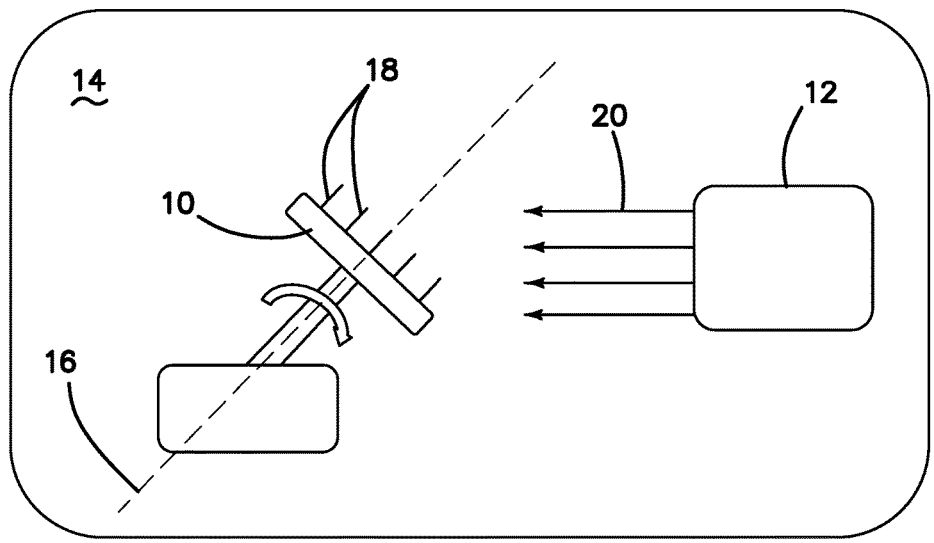
FIG. 1 is a schematic illustration of the inventive process.
Figure 2:
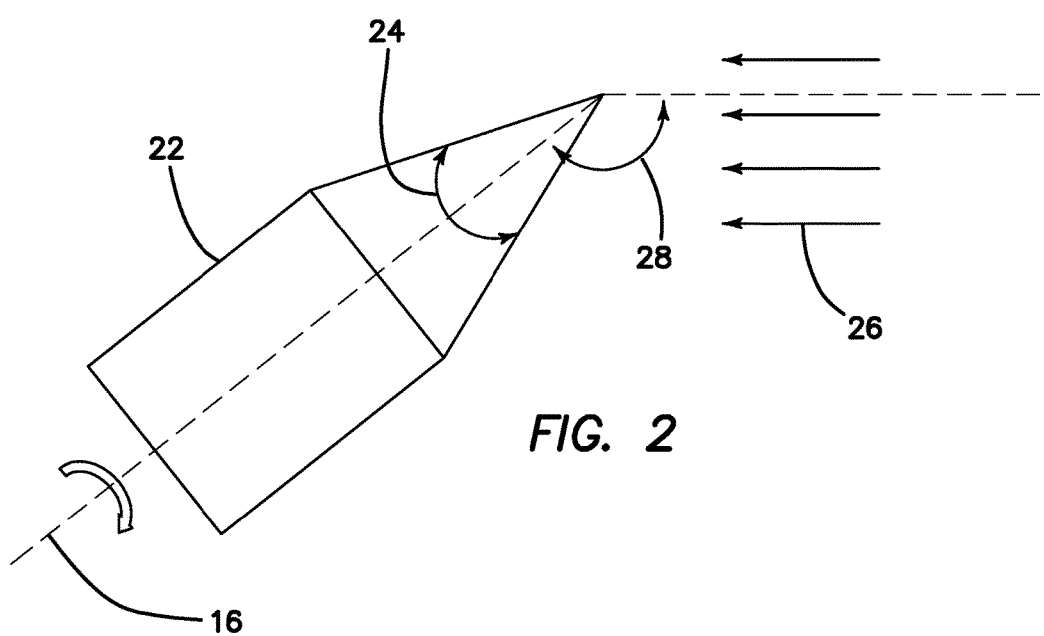
FIG. 2 shows angles in the process.
Figure 3:
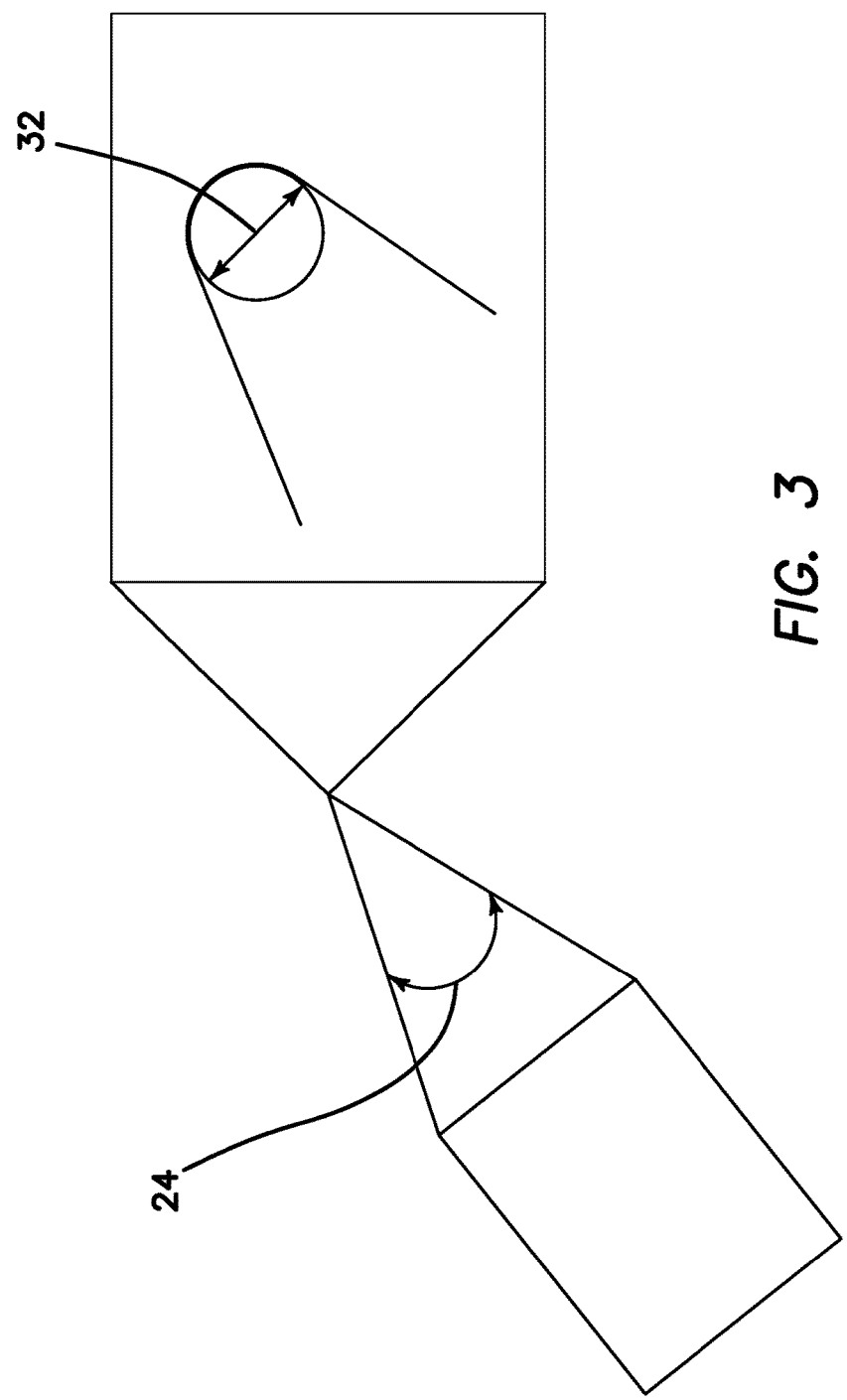
FIG. 3 illustrates the cone angle and diameter or curvature of the SPEM.
Figure 4:
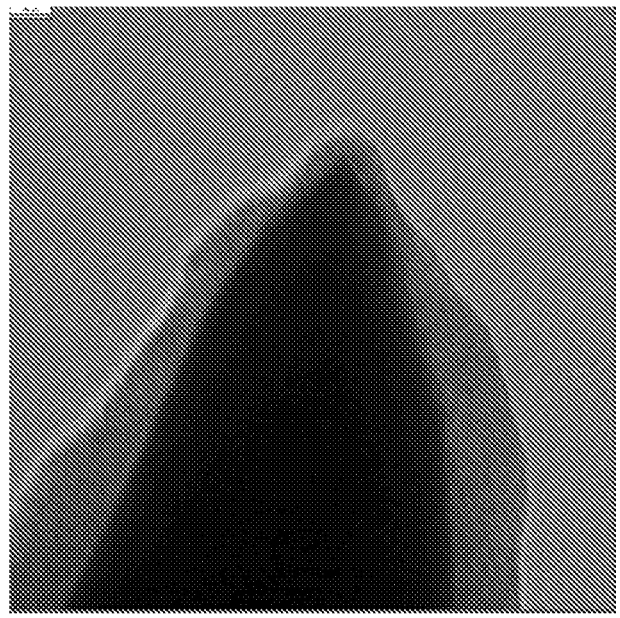
FIG. 4 illustrates a tip (dark, central tip) having an oxide coating (seen as a lighter coating). The small rectangular bar in the left hand corner is a scale showing the length of 10 nm.
Figure 5:
FIG. 5 illustrates a tip (dark, central tip) without an oxide coating. The small rectangular bar in the left hand corner is a scale showing the length of 10 nm.
Figure 6:
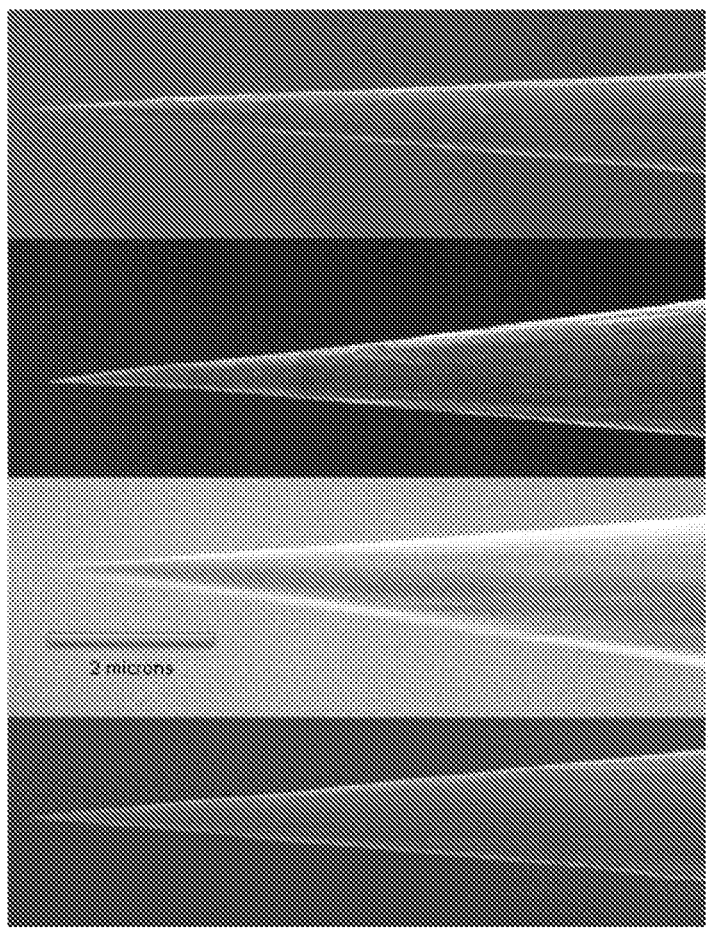
FIG. 6 shows four representative examples of probes after ion milling. Striations can be seen on the surface of these probes parallel to their longitudinal axis. They appear after exposure to an impinging beam of Ar ions.

A schematic view of the inventive process is illustrated in FIGS. 1-3. A batch of wire pieces 18 is fixed onto a stage 10 (also called a support). A "batch" of wire pieces (or SPEM probes) refers to a group of 5 to 10,000; preferably 10 to 1000 wire pieces. The stage is then rotated around a central axis 16 that is perpendicular to the top surface of the stage 10, typically at a rate of at least 1 revolution per minute (rpm), preferably in the range of 1 to 100 rpm, in some embodiments in the range of 50 to 70 rpm. Typically, the wire pieces in a batch are arranged in a square array, and the long axes of the wire pieces 18 are approximately parallel with the central axis of rotation 16 of the stage 10. The stage 10 and ion beam 20 are disposed within evacuation chamber 14. The entire batch of wires should be exposed to the broad ion beam 20 generated by broad beam ion source 12. Thus, the size of the rotating array of wires (square or other shape) should be enveloped by the size of the ion beam 20. In some preferred embodiments, the ion beam has a circular area (perpendicular to the beam direction 26) and a diameter of 5 to 50 cm, in some embodiments 5 to 20 cm. The ion flux from the source is in the range of $10^{14}$ to $10^{17}$ ions/cm²s. The ions are obtained from neon, argon, or krypton gases, or mixtures of these gases. In addition to the inert gases, hydrogen, oxygen, and nitrogen can be used individually, in combination with each other and/or in combination with neon, argon, or krypton, for ion processing. Preferably, the ion beam is made up of Ar ions. Neutral Ar atoms may also be present as chamber background pressure used to operate the ion source. Also, electrons may be present as a means of collimating the ion beam. The angle 28 between the direction of incident ion beam and axis of rotation is known as the ion angle, which may be set in the range of 5° to 70°, preferably 10° to 70°, preferably 15° to 65°, preferably 40° to 70°, preferably 40° to 55°, in some embodiments 53° to 57°. The ion beam is set to an ion energy in the range of 100 eV to 3500 eV; preferably 200 eV to 3000 eV, more preferably 500 eV to 2500 eV, in some embodiments in the range of 1000 eV to 2000 eV, and in a specific embodiment about 1500 eV. The exposure to the ion beam is preferably conducted with a current density of 0.1 to 1 mA/cm², more preferably from 0.2 to 0.8 mA/cm², still more preferably from 0.4 to 0.6 mA/cm². In preferred embodiments, the time for exposure can be for 20 to 120 minutes; preferably for 30 to 90 minutes; or 60 minutes to 120 minutes; or more than 120 minutes; and may be for about 60 minutes.

When the milling is complete, the ion beam exposure is stopped and the wires are removed from the stage. The resulting probes comprise a probe body 22 and a tip characterizable by a cone angle 24 (also called taper angle or tip angle) and diameter of curvature 32. There should be a single tip on each probe body 22 since multiple tips on a probe results in inferior properties. Typically, the probes have striations, which are indicative of ion milling. The probe tips preferably have cone angles of 5° to 45°, more preferably in the range of 5° to 30°, still more preferably in the range of 5° to 15°, and still more preferably in the range of 9° to 15°. The diameter of curvature is preferably in the range of 1 to 35 nm; in some embodiments in the range of 5 to 35 nm, or 10 to 35 nm, or 15 to 30 nm. In some embodiments, the tip is substantially oxide free. These unique and novel properties are enabled by the methods of the present invention. These properties, or any selected combination of these properties, are present on individual probes and are preferably present on all or at least 80% or at least 90% of a batch.

In general, this technique creates tips that are substantially cylindrically symmetrical about the tip axis. Some degree of asymmetry is tolerable, but the most useful tips are those that are reasonably symmetrical, as could be judged by a person experienced with working with SPEM probes. The properties of SPEM probes can be measured by electron microscopy, typically transmission electron microscopy (TEM).

EXAMPLES

Tungsten wire pieces of diameter between 0.15 mm and 1.00 mm and about 2 cm in length are etched to a point with a diameter of curvature of less than 100 nm using known procedures (see the previously cited Zhang et al.). These etched wire pieces are then secured onto a flat stage such that the long axes of the wires are perpendicular to the surface of the stage, with the tip pointing away from the stage surface. The stage is then attached to a rotation mechanism that is located inside an evacuation chamber as shown in FIG. 1. The stage is tilted so that the long axes of the wire pieces are oriented at a pre-specified angle, called the ion angle, ranging from 0 to 90° with respect to the incident argon ion beam. In another embodiment of the invention, the angle is varied during ion beam processing.

The broad beam ion source used was a Kaufman type source, which produces a nearly uniform ion beam across its exit aperture. The exit aperture is 10 cm in diameter. In addition to emitting ions, the source incorporates a neutralizer filament that thermionically emits electrons, which create space charge neutrality and prevent the ion beam from blooming. The tips to be sputtered were located about 30 cm from the exit aperture of the ion source. The ion energy range used with the source is 100 eV to 1500 eV and the ion beam current can range from 10 mA to 100 mA. This corresponds to a flux range from $7\times10^{14}$ ions/cm$^2$s to $7\times10^{15}$ ions/cm$^2$s.

Specific processing conditions used argon ions at an energy of 1500 eV and a flux of $3\times10^{15}$ ions/cm$^2$s. During ion processing, the sample holder is rotated on its axis at about 60 rpm, and the typical processing time is 60 minutes.

What is claimed:

1. A method of making SPEM probes, comprising:
   mounting a plurality of wire pieces to a rotatable stage;
   wherein an evacuation chamber houses an ion beam, the stage, and the plurality of wires;
   wherein the plurality of wires have lengths of 0.5 cm to 3.0 cm;
   rotating the stage with mounted wire pieces and simultaneously milling the wires with an ion beam having an ion energy in the range of 1 to 3500 eV to produce the probe tips mounted to the stage;
   wherein the rotating stage has an axis of rotation;
   wherein the angle between the axis of rotation and the ion beam is from 5° to 70°;
   where the angle is defined with respect to the axis of rotation such that 0° is defined to be the angle if the ion beam originates from directly above the stage and is parallel to the axis of rotation;
   and removing the wires from the stage.

2. The method of claim 1 wherein the ion beam comprises Ar ions.

3. The method of claim 1 wherein the angle between the axis of rotation and the ion beam is from 15° to 65°.

4. The method of claim 1 wherein the angle between the axis of rotation and the ion beam is from 45° to 65°.

5. The method of claim 1 wherein the wire pieces mounted to stage are not subjected to electropolishing prior to milling.

6. The method of claim 1 wherein the plurality of wire pieces are tungsten wires.

7. The method of claim 1 wherein the plurality of wire pieces comprise a material selected from the group consisting of beryllium copper (Be—Cu) alloy, platinum (Pt), iridium (Ir), platinum-iridium (Pt—Ir) alloy, tungsten (W), tungsten-rhenium (W—Re) alloy, palladium (Pd), palladium alloy, gold (Au), Pd along with small percentages of Ag, Au, Pt, Cu, and Zn, and Pd alloys with Pd, Ag, and Cu.

8. The method of claim 1 wherein the plurality of wires have a diameter between 0.15 mm and 1.00 mm.

9. The method of claim 1 wherein the plurality of wires have a length in the range of 1.5 to 2.5 cm.

10. The method of claim 1 wherein the wire pieces mounted to stage are subjected to electropolishing prior to milling.

11. A method of making SPEM probes, comprising:
    mounting a plurality of wire pieces to a rotatable stage;
    wherein the plurality of wire pieces are tungsten wires comprising a coating of $HfB_2$;
    rotating the stage with mounted wire pieces and simultaneously milling the wires with an ion beam having an ion energy in the range of 1 to 3500 eV to produce the probe tips mounted to the stage;
    wherein the rotating stage has an axis of rotation;
    wherein the angle between the axis of rotation and the ion beam is from 5° to 70°;
    where the angle is defined with respect to the axis of rotation such that 0° is defined to be the angle if the ion beam originates from directly above the stage and is parallel to the axis of rotation.

12. The method of claim 11 wherein the ion beam has an ion energy in the range of 500 eV to 2500 eV.

13. A method of making SPEM probes, comprising:
    providing a broad beam ion source that generates an ion beam;
    mounting a plurality of wire pieces to a rotatable stage;
    providing an evacuation chamber housing the ion beam, stage and plurality of wires;
    wherein the plurality of wires comprises a batch of 5 to 10,000 wire pieces;
    wherein the stage is rotated at a rate of 1 to 100 rpm; and
    rotating the stage with mounted wire pieces and simultaneously milling the wires with the ion beam having an ion energy in the range of 100 eV to 3500 eV to produce the probe tips mounted to the stage;
    wherein the rotating stage has an axis of rotation;
    wherein the angle between the axis of rotation and the ion beam is from 5° to 70°;
    where the angle is defined with respect to the axis of rotation such that 0° is defined to be the angle if the ion beam originates from directly above the stage and is parallel to the axis of rotation.

14. The method of claim 13 wherein the ion flux from the source is in the range of $10^{14}$ to $10^{17}$ ions/cm$^2$s; wherein the ion beam has an ion energy in the range of 1000 eV to 2000 eV; wherein the ion beam is conducted with a current density of 0.2 to 0.8 mA/cm$^2$; and wherein the exposure to the ion beam is conducted for 30 minutes to 120 minutes.

15. The method of claim 14 wherein at the end of the exposure the wires are removed from the stage and wherein at least 80% of the individual probes have the following features: a single tip on each probe body having cone angles of 5° to 30°, and a diameter of curvature in the range of 15 to 30 nm.

16. The method of claim 13 wherein the plurality of wires have a diameter between 0.15 mm and 1.00 mm and a length in the range of 0.5 to 3.0 cm.

17. The method of claim 13 wherein the angle between the axis of rotation and the ion beam is from 15° to 65°.

18. The method of claim 13 wherein the angle between the axis of rotation and the ion beam is from 40° to 55°.

19. The method of claim 13 wherein the ions in the ion beam are obtained from neon, argon, or krypton gases, or mixtures of these gases.

20. The method of claim 13 wherein the ion beam has an ion energy in the range of 500 eV to 2500 eV.

* * * * *